United States Patent [19]

Nor

[11] Patent Number: 5,670,861
[45] Date of Patent: Sep. 23, 1997

[54] BATTERY ENERGY MONITORING CIRCUITS

[75] Inventor: Jiri K. Nor, Oakville, Canada

[73] Assignee: Norvik Tractions Inc., Mississauga, Canada

[21] Appl. No.: 372,936

[22] Filed: Jan. 17, 1995

[51] Int. Cl.$^6$ ................................................ H01M 10/44
[52] U.S. Cl. .................................................. 320/15; 320/48
[58] Field of Search ................................. 320/15, 17–18, 320/21, 5–6, 48, 47, 49, 54–55, 29, 31, 27–28

[56] References Cited

U.S. PATENT DOCUMENTS

| | | | |
|---|---|---|---|
| 3,786,343 | 1/1974 | Ehlers | 320/48 |
| 4,280,097 | 7/1981 | Carey et al. | 320/48 |
| 4,484,130 | 11/1984 | Lowndes et al. | 320/17 |
| 4,733,326 | 3/1988 | Harsch et al. | 361/159 |
| 4,871,956 | 10/1989 | Barrella | 320/48 |

(List continued on next page.)

FOREIGN PATENT DOCUMENTS

| | | | |
|---|---|---|---|
| 0 498 679 A2 | 12/1992 | European Pat. Off. | H02J 7/00 |
| 0 609 101 A1 | 3/1994 | European Pat. Off. | H01M 10/42 |
| 9017333 U | 5/1991 | Germany | H02J 10/42 |
| 42 25 746 A1 | 2/1994 | Germany | H02J 7/00 |
| WO93/08629 | 4/1993 | WIPO | H02J 7/10 |

OTHER PUBLICATIONS

12th International Electric Vehicle Symposium publication, dated Dec. 5, 1994, Nor, Jirik.; Smith, David, R., "Very Fast Battery Charging . . . ".
12th International Electric Vehicle Symposium publication, dated Dec. 5, 1994, Levain, P.; Kechmire, M., "Fleet Monitoring . . . ".

*Primary Examiner*—Peter S. Wong
*Assistant Examiner*—Kyung Shin
*Attorney, Agent, or Firm*—Donald E. Hewson

[57] ABSTRACT

A long chain battery, particularly for an electric vehicle, comprises a plurality of series connected cells or battery modules. To control the operation of the electrical functions, including discharge while the vehicle is being driven, charging when it is at a charging station, or regenerative charging during braking, a main control module and a plurality of battery monitoring modules are provided. The electric motor and a traction controller therefor are connected in series across the long chain battery, and other vehicle electrical loads are in parallel with the motor and controller. Each battery monitoring module will monitor a number of batteries, and the current carrying wire between them, so that incipient problems may be detected before failure or significant damage occurs. A serial communications bus is provided between the main control module and the battery monitoring modules, and data transmitted over that bus is generally digitally encoded. Sensitive analog circuitry in the battery monitoring modules is located in proximity to the battery modules with which it is associated, and is galvanically isolated from the digital communication circuitry and the data communications bus transmitting the data to the main control module. Any switching or other controllers in the battery are galvanically isolated from the battery monitoring modules and the main control module. Means are provided to isolate specific cells or battery modules, as required; other means are provided to ensure that important voltage and/or current samplings are indicative of equilibrium of the electrical charge or discharge reactions, so that erroneous readings taken during fast acceleration or braking, or other circumstances except essentially steady state conditions, may be discarded. Other means are provided whereby the driver of an electric vehicle receives warnings as the available energy still within the battery depletes below specified levels; and further means are provided to ensure that rate of discharge or regenerative charging of the battery do not exceed predetermined limits.

4 Claims, 7 Drawing Sheets

U.S. PATENT DOCUMENTS

| | | | |
|---|---|---|---|
| 5,153,496 | 10/1992 | LaForge | 320/17 |
| 5,179,335 | 1/1993 | Nor | 320/21 |
| 5,202,617 | 4/1993 | Nor | 320/2 |
| 5,204,611 | 4/1993 | Nor et al. | 320/35 X |
| 5,206,578 | 4/1993 | Nor | 320/48 X |
| 5,325,041 | 6/1994 | Briggs | 320/48 |
| 5,349,540 | 9/1994 | Birkle et al. | 364/578 |
| 5,352,968 | 10/1994 | Reni et al. | 320/35 |
| 5,387,857 | 2/1995 | Honda et al. | 320/18 |
| 5,412,323 | 5/1995 | Kato et al. | 320/31 |
| 5,422,558 | 6/1995 | Stewart | 320/5 X |
| 5,426,589 | 6/1995 | Kitagawa et al. | 320/29 X |
| 5,469,042 | 11/1995 | Rühling | 320/17 |
| 5,487,002 | 1/1996 | Diller et al. | 320/49 X |
| 5,488,282 | 1/1996 | Hayden et al. | 320/17 |

BATTERY ENERGY MONITORING CIRCUITS

FIELD OF THE INVENTION

This invention relates to monitoring and control apparatus, and methods, for monitoring the state of charge and for controlling and monitoring the charging, regenerative charging, and discharge, of a long chain battery. In particular, the present invention is directed to monitoring and control of a long chain battery when it is installed in an electric vehicle.

BACKGROUND OF THE INVENTION

The use of batteries which comprise a long chain of series connected cells or battery modules, is becoming more widespread. While long chain batteries may be found in circumstances such as traction batteries for cargo handling units such as fork-lift trucks and the like, or golf carts, or standby batteries for satellite and/or telecommunications stations, a principal utilization of long chain batteries is now becoming their use in electric vehicles.

Electric vehicles are becoming more popular for a variety of reasons. Indeed, electric vehicles may become mandated to a greater or lesser extent due to the imposition of regulations requiring that at least a certain percentage of vehicles sold by any one manufacturer of vehicles—especially, passenger cars with seating from two to nine passengers, including the driver—and which are conventionally powered by internal combustion engines, must also include a specific number of vehicles that are so-called "zero emission" vehicles. That means that such vehicles have no emissions of noxious gasses, and the most common type of vehicle which would meet such stringent standards is an electric vehicle. Electric vehicles are powered by batteries, which may present a number of problems or other difficulties to be overcome.

Not the least among those problems is the fact that in order for an electric vehicle to have any reasonable range—the distance that it can be driven—there has to be significant energy storage by way of the battery on board the vehicle. Usually, the battery is a long chain battery, comprising a plurality of series connected cells or battery modules. As the vehicle is driven, it uses energy from the batteries, convening it to driving power delivered to the wheels of the vehicle. Even with regenerative recharging of the battery, there is only a finite distance or period of time over which the vehicle can be operated without required that the battery be fully recharged.

Moreover, it should be noted that long chain batteries found in electric vehicles may have vastly different battery capacities, battery voltages, and perhaps even be of different battery types. For example, several different types of batteries that may be utilized include nickel cadmium, nickel metal hydride, and lead acid batteries.

It is anticipated that most electric vehicles will be equipped with a Battery Energy Management System (BEMS). Such a system may be programmed so as to utilize charging algorithms which have been developed and which are now becoming available to the market in association with the trade mark MINIT-CHARGER of Norvik Technologies Inc., the assignee herein. Of course, other charging systems or battery charge controllers may be utilized.

Charging control, and a universal charging station and method for charging electric vehicle batteries, whereby fast delivery of charging energy to a long chain battery in an electric vehicle, are discussed in copending U.S. patent application Ser. No. 08/275,878 filed Jul. 6, 1994, and assigned to Norvik Technologies Inc. That charging station is capable of delivering 20 to 50 kWh to an electric vehicle battery in 10 or 20 minutes.

The present invention provides a battery energy monitoring circuit, including a battery energy management system, and additions teachings as to the modularity by which the battery energy management system may be assembled.

The manner by which individual modules in a long chain battery may be identified and bypassed in the event that such a step is necessary, is discussed; and certain teachings of specific structure and circuit arrangements will be made.

Further subjects to be discussed herein include matters relating to the monitoring of contact resistance within the wiring of a long chain battery, so as to avoid safety hazards in the high current environment of the battery. Various methods for determining electrochemical potential measurement during charge or discharge of the long chain battery, in some respects under less than ideal conditions when it is not possible to totally interrupt current flow from the battery, are discussed herein. The present discussion then leads to discussions of methods of determination of resistance free voltage by extrapolation, even in circumstances where it has not been possible to totally interrupt the current flow to or from the long chain battery. However, readings which are indicative of resistance free voltage of the battery must be taken or utilized only in conditions when the readings can be accepted as being indicative of equilibrium of the electrical charge or discharge reaction taking place in the long chain battery.

Other discussion will follow as to the manner by which overcharge or overdischarge of the long chain battery may be prevented or precluded. At the same time, a better "fuel gauge" by which the driver of an electric vehicle may be better apprised of the state of charge of the battery, and more particularly when he will receive sufficient warning of "low fuel" whereby nearly complete discharge of the battery is incipient, is discussed. At the same time, it is recognized that regenerative braking provides a means of somewhat recharging the long chain battery. Moreover, it is recognized that both the charge acceptance and discharge ability of the battery must be monitored and respected. Thus, the current being fed to the battery or discharged from the battery during operation of the vehicle, must not exceed permissable limits at any state of charge of the battery.

Still further discussion will follow as to the means by which battery safety may be assured, with reference to the energy considerations surrounding the matter of increased battery safety. Finally, a proposal for an integrated module design for each cell or battery module of a long chain battery, is made herein.

DESCRIPTION OF THE PRIOR ART

For a further understanding of the present invention, and for greater discussion of underlying technologies relating to charging stations for electric vehicles, Applicant refers to the following patents:

First, a basic teaching of fast charging battery chargers is found in NOR U.S. Pat. No. 5,179,335, issued Jan. 12, 1993. That patent teaches battery chargers where the electric charging power delivered to the battery is periodically interrupted for a preselected timed interval so as to permit the detection of the internal resistance free voltage of the battery during the interruption of the charging power. Circuitry is provided for comparing the internal resistance free voltage with a preselected reference voltage; and additional circuitry is provided to reduce the power being delivered to the battery when the internal resistance free voltage of the battery exceeds the preselected reference voltage. Thus, the rate of charging the battery is gradually reduced.

NOR U.S. Pat. No. 5,202,617, issued Apr. 13, 1993, teaches a fundamental charging station for electric vehicles. There, the electric vehicle battery may be charged either under control of an on-board controller, or the charging operation may be manually controlled. The patent requires a power connector and associated power cable for connecting to the vehicle, an interface with signal cables to carry status and/or control signals between the vehicle and the power controller within the charging station, and a lockout which precludes delivery of power to the vehicle except when the power connector is in place. When the charging operation is under the control of an on-board controller, the operation of the charging station is battery specific, and thus the operating parameters of the charging station may vary from one electric vehicle to another.

NOR et al were issued U.S. Pat. No. 5,204,611 on Apr. 20, 1993, for a more advanced battery charger. There, the resistance free terminal voltage of the battery is detected during an interval when the charging current is interrupted and compared against an independent reference voltage; but the reference voltage may be altered at any instant in time as a function of the ambient temperature, or the internal temperature or pressure of the battery, or as a function of the charging current when it is within a predetermined range, or even if a particular change in the value of charging current occurs over a predetermined period of time. These various provisions preclude, for example, thermal runaway, and they assure very rapid and complete charging operations of the battery not matter what its condition may have been when it was first connected to the battery charger, provided that it is capable of accepting charge in the first instance.

NOR U.S. Pat. No. 5,206,578, issued Apr. 27, 1993, teaches a monitoring system for batteries during charge or discharge whereby terminals are placed between adjacent pairs of modules and at the end of each battery so that voltage across each module may be measured at the pair of terminals that defines the module. Some or all of the modules may be tested periodically, such as by appropriate operation of a multiplexer. Alarms may be triggered in the event that module voltages are outside of predetermined limits. The testing may, in fact, continue no matter whether the battery is being charged or discharged.

European patent application P413229.0-35 is directed to a self-contained on-board unit which is powered by the vehicle battery, and which provides a switching scheme which allows selective routing of equalizing or finishing current to individual modules in a long chain battery. However, while this scheme allows for full charge of the "strong modules" in the battery without overcharging "weak modules", it is unable to redistribute the much larger currents that are needed for traction at the end of discharge of the long chain battery. Thus, the discharge capacity of the long chain battery will still be limited by the discharge capacity of the weakest module therein.

SUMMARY OF THE INVENTION

In its most general aspect, without regard to the specific purpose for which the long chain battery is to be used, or without regard to whether it is installed in an electric vehicle, the present invention provides a monitoring and control apparatus for a battery which comprises a long chain of series connected cells or battery modules. The monitoring and control apparatus of the present invention is a circuit which comprises a main control module having a plurality of input and output ports, at least one battery monitoring module, each having input and output communications with the main control module, and a current sensor which is in series with the long chain battery. The current sensor has a sensed current input to the main control module. The main control module includes current control means, means for controlling external means or circuits used for periodically interrupting or changing the current flow in the long chain battery, voltage reading means for receiving and storing voltage information from each of the battery monitoring modules, timing means, microprocessor means, annunciator means, battery monitoring module control means, temperature monitoring means, and serial communications bus means. Each of the battery monitoring modules include serial communications bus means as well, and data acquisition circuitry which comprises cell or battery voltage monitoring means for each cell or battery module with which it is associated. Each battery monitoring module also includes control means for controlling switches that are within each cell or battery module, or series connected with each cell or battery module. The main control module and the battery monitoring modules are in communication with one another over the serial communications bus means. Finally, the data acquisition circuitry in each of the battery monitoring modules, which is galvanically connected with the respective cells or battery modules with which it is associated, is also galvanically isolated from the serial communications bus means.

When the apparatus of the present invention is installed in an electric vehicle, together with a long chain battery, the main control module will further connect to a vehicle communications bus over which it provides control, monitoring, and feedback communications to and from a drive controller in the electric vehicle. The electric vehicle has an electric motor and a traction controller therefor, which are connected in series across the battery. There are also other vehicle electrical loads in parallel with the electric motor and traction controller, across the battery. A power delivery connector is provided for delivering charging current from a source of charging current to the battery, so as to recharge the battery. The drive controller controls the traction controller and the electric motor over the vehicle communications bus. Finally, the power delivery connector and the electric motor terminals and other junctions in the power delivery circuit are connected to monitoring means therefor, where the monitoring means are located within the battery monitoring modules.

In general, the main control module will include a charge control interface to control charging of the battery when it is connected through the charge connector to a battery charger, it may have an auxiliary data port, and it will include at least one or more other auxiliary inputs and outputs that will be required to monitor and control displays and other electrical operating appliances and auxiliary equipment—dashboard displays, temperature sensors, contractors or battery disconnecters, battery cooling fans, battery watering valves, heaters, air conditioners, etc., as may be installed in the electric vehicle. There is also an input from an external ambient temperature sensor which will be mounted in the electric vehicle, whereby either external ambient temperature outside the vehicle, or more particularly where ambient temperature within the compartment in which the long chain battery is installed, will be monitored. At least one or more other microprocessors and switches as may be required to monitor and control all of the other electrically operating appliances and auxiliary equipment, temperature sensor and the like, will also be found in the main control module.

Each of the battery monitoring modules will further include at least one or more other auxiliary inputs and outputs as they may be required to monitor and control any electrically operating appliances and auxiliary circuits or equipment that are associated with any respective cells or battery modules, or any selected grouping of cells or battery modules, with which each of the battery monitoring modules is associated. Also, each battery monitoring module will further include one or more additional inputs and outputs as required to connect and control any sensors which monitor and detect cell or battery temperature or cell or battery internal pressure, for each individual cell or battery module with which each battery monitoring module is associated.

As will be discussed hereafter, data and other transmissions over the serial communications bus means will generally be digitally encoded, to reduce noise and interference. Also, the present invention provides means whereby all of the battery current carrying wiring which is external to each of the cells or battery modules of the long chain battery will, itself, be monitored for changes in resistance or voltage which may occur in that wiring. To reduce fire hazard, the wiring associated with each cell or battery voltage monitoring means and the cell or battery module with which it is associated will generally be connected to power cable clamps or terminals that are used to connect the high current carrying battery wiring.

Still further, the power delivery connector and the electric motor and traction controller wiring may be monitored for changes in resistance or voltage which may occur therein, by connecting them to a further or assigned battery monitoring module having an input for those purposes.

A further aspect of the present invention is to provide each cell or battery module in a chain of cells or battery modules with a high current capacity single pull, double throw switch and a bypass current conductor. One throw of each single pull, double throw switch is connected to a first end of the cell or battery module, and the other end of that cell or battery module is connected to the common point of the next single pull, double throw switch in the series connected long chain battery. The other throw of each of the single pull, double throw switches connects to the bypass current conductor associated with the respective cell or battery module, and through the bypass conductor also to the common point of the next single pull, double throw switch in series with it. By this arrangement, any or all of the cells or battery modules may be bypassed. Moreover, if all of the cells or battery modules in the chain are bypassed, then the same respective end of each of the cells or battery modules is connected to a single bus which comprises the series connected bypass conductor, and the other ends of each of the cells or battery modules are isolated.

Each of these above noted switches may be a mechanical switch or a solid state, semiconductor switch.

Each cell or battery module may be configured as a two-terminal module having two sides. One side will comprise a cell or battery in series with a parallel connection with a first semi-conductor switch and a forward facing free wheeling diode—forward facing, that is, with respect to the polarity of the cell or battery and the flow of charging current. The other side will comprise a bypass current conductor which is also in series with a parallel connection of a second semi-conductor switch and a rearward facing free wheeling diode—with respect to the polarity of the cell or battery. To preclude against the chance that both of the switches are closed at the same time, interlock control means is provided to preclude that opportunity.

Galvanic isolation of the data acquisition circuitry connected with the cells or battery modules, or of any of the switches described above with respect to the data transmission and communications circuitry, may be effected by various means inside the battery monitoring modules, usually by the use of optocouplers.

In another aspect of the present invention, methods of taking the resistance free voltage reading of the cells or battery modules a long chain battery are provided. The difficulty is that it is often impossible to completely interrupt the current flow through the battery so as to take resistance free voltage readings of one or more cells or battery modules. Thus, the present invention provides methods whereby battery current may be either reduced or increased by external means, and the resistance free voltage may be computed by linear extrapolation.

In the first instance, an energy storage filter may be provided so as to continue to feed electrical energy to the electric motor, even if a switch which is upstream of the electric motor of the electric vehicle—that is, interposed between the electric motor and its associated traction controller, and the battery—is opened so as to initiate a diagnostic period of time. The energy storage filter is generally an inductor in series with the switch or a capacitor in parallel, or both, with a free wheeling diode which is placed across the battery and in parallel with the series connected electric motor and traction controller. The switch is opened for a period of time which is less than the time constant of the energy storage filter.

Another method is to control the traction controller so that, for a brief diagnostic period of time, a current flows which is substantially different from the current flowing just before the diagnostic period. This may be, for example, 50% of such traction current, so that a complete loss of torque is not felt in the traction system. Alternatively the traction current may be reduced to zero for the brief diagnostic period, by the traction controller so that only the current taken by the other than traction motor loads continues to flow. In either event, a comparison is made by which the current reading taken just prior to the diagnostic period is compared with the current reading taken during the diagnostic period, and then the resistance free voltage is mathematically determined by extrapolating the current readings due to the linear relationship of voltage, current, and resistance, under Ohm's law.

Alternatively, the current flowing through the traction motor may be reversed for the brief diagnostic period. The reverse (braking) current may be chosen conveniently to equal the current consumed by the other loads, in which case the current flowing through the battery would become zero, and a resistance free voltage measurement can be effected directly without the need for mathematical extrapolation. A braking action of the motor, lasting several milliseconds, should not be felt by the occupants of the vehicle due to the inertia of the traction system and the vehicle.

Still further, another switch can be provided downstream of the electric motor and traction controller, whereby just the other electrical loads in the electric vehicle may be periodically interrupted during a diagnostic period of time. Once again, current readings taken before the diagnostic period and during the diagnostic period can be mathematically extrapolated, and the resistance free voltage determined.

Of particular interest and note is yet a further method for determining resistance free voltage, whereby a series connection of a further load resistor and a high current capacity switch is connected in parallel with the series connected electric motor and traction controller. The switch is periodically closed for a diagnostic period of time, during which the current drawn from the battery will briefly increase. Once again, readings are taken just prior to closing the switch and during the diagnostic period, and mathematic extrapolation will determine the resistance free voltage from the current readings taken.

In keeping with a further refinement of the invention, several readings may be taken and they are digitally filtered and averaged. Still further, the present invention provides means whereby calculations can be made to determine the slope which characterizes the readings taken during operating current flow and during a diagnostic period, whereby if the readings are taken at a time when equilibrium of the electrical charge or discharge reaction of the long chain battery is not prevailing, then the readings will be discarded.

Finally, the present invention provides methods of controlling the rate of charge or discharge current, to ensure that either the characteristic charge acceptance curve or discharge ability curve of the long chain battery are not exceeded. For example, during discharge of the long chain battery, the discharge current is continuously monitored and if the discharge current reaches a point when it and the state of charge of the battery are such that they are on the discharge ability curve of the battery, then the discharge current is controlled so that excessive current is not permitted to flow through the battery and cause damage thereto. Also, during regenerative charging as braking occurs and the electric motor becomes a generator, the maximum allowable regenerative charging current fed to the battery is not permitted to exceed the charge acceptance curve, and generally is held below the charge acceptance curve.

BRIEF DESCRIPTION OF THE DRAWINGS:

Embodiments of this invention will now be described by way of example in association with the accompanying drawings in which.

DETAILED DESCRIPTION OF THE PREFERRED EMBODIMENTS

Reference will now be made to FIGS. 1 through 11.

Figure 1:
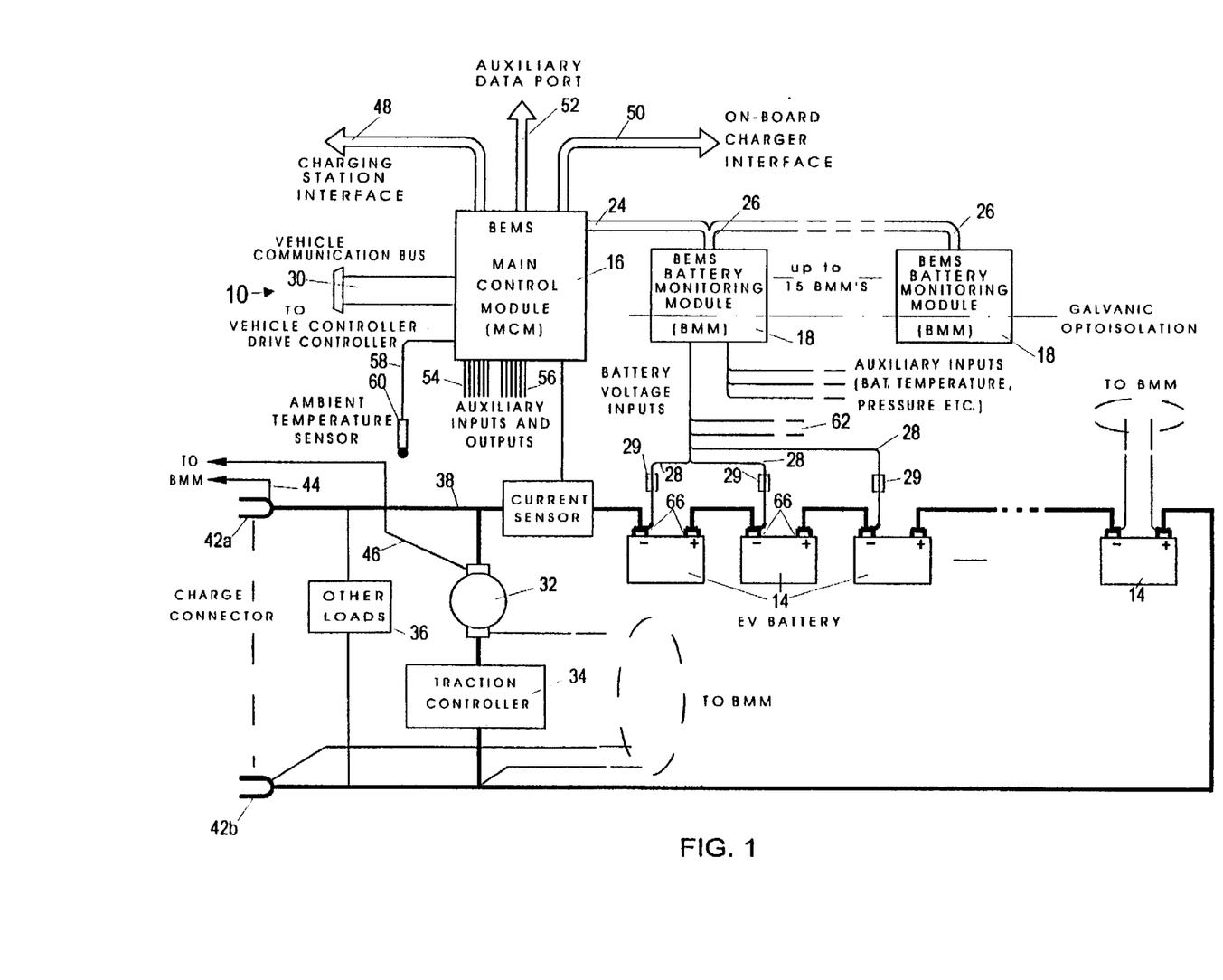
FIG. 1 is a simplified block schematic of the monitoring and control circuit for the apparatus of the present invention.

Turning first to FIG. 1, a simplified block schematic of the monitoring and control apparatus of the present invention, installed in an electric vehicle, is shown. The circuit 10 comprises a long chain battery 12, which is configured with a plurality of series connected cells or battery modules 14. A main control module 16 is provided, and a plurality of battery monitoring modules 18 is also provided.

The main control module 16 includes operating components such as a voltage reading means (not shown) for receiving and storing voltage information from each of the battery monitoring modules 18, timing means (not shown), microprocessor means (not shown), annunciator means (not shown), a battery monitoring module control means (not shown) by which each of the battery monitoring modules 18 may be controlled, and a temperature monitoring means (not shown). Each of the specific components found in the main control module, but not specifically shown, is of the sort which are not unlike similar components discussed in any of the NOR or NOR et al patents mentioned above. A serial communications bus 24 communicates with the main control module 16, and to each battery monitoring module at 26.

Other data acquisition circuitry within the battery monitoring modules is provided (not shown), whereby cell or battery voltage monitoring means are provided so that each cell or battery module 14 is connected via respective wires 28 to the battery monitoring module 18. Wires 28 may be equipped with a protective device 29, such as a resistor or fuse, which is usually installed in proximity to the cell or battery module terminal. As described hereafter, there will also be control means (not shown) for controlling switches that are within, or are series connected with, each of the cells or battery modules 18. As above, each of the specific components found in the main control module, but not specifically shown, is of the sort which are not unlike similar components discussed in any of the NOR or NOR et al patents mentioned above.

As described above, the main control module 16 and the battery monitoring modules 18 are in communication with one another over the serial communications bus 24.

As noted hereafter, the data acquisition circuitry within each of the battery monitoring modules 18 is galvanically isolated from the serial communications bus 24.

The electric vehicle (not specifically shown) has installed in it the above described circuitry, together with the following circuitry, as shown in FIG. 1. The main control module 16 includes a vehicle communication bus 30 which provides control, monitoring, and feedback communications to and from a drive controller (not shown) located in the electric vehicle. The drive controller is essentially equivalent to an accelerator in a vehicle that is powered by an internal combustion engine. The drive controller communicates over the vehicle communications bus with an electric motor 32 and a traction controller 34. The electric motor 32 and traction controller 34 are connected in series across the battery 12. Other vehicle electric loads are identified generally at 36, and those other electric loads are in parallel with the electric motor 32 and traction controller 34, across the battery. The high current wiring for the electric vehicle is shown generally at 38, and it is monitored by a current sensor 40 which communicates with the main control module 16. Also, the high current wiring 38 is connected to a power delivery connector 42a, 42b, which is provided to deliver charging current from a source thereof—such as a charging station of the sort described in U.S. Pat. No. 5,202,617, noted above. The power delivery connector 42a, 42b and the electric motor 32 are connected to monitoring means therefor which are located within the battery monitoring modules 18, over monitoring wiring 44 and 46, respectively.

The main control module 16 also further includes a charge control interface which may be bifurcated to charging station interface 48 and an on-board charger interface 50. The charge control interface controls charging of the battery when it is connected through the charge connector 42a, 42b to a battery charger, in a manner described in any of the NOR or NOR et al patents referenced above. An auxiliary data port 52 is provided, as may be required; and at least one or more other auxiliary inputs and outputs shown generally at 54, 56, are provided for the main control module 16. The auxiliary inputs and outputs 54 and 56 are required to monitor and control displays and other electrically operating appliances and auxiliary equipment that are located in the electric vehicle. Also provided in the main control module 16 is an input 58 from an ambient temperature sensor 60 which is mounted in the electric vehicle. There may also be one or more other microprocessors and switches within the main control module 16 as may be required to monitor and control the input, output, or operation of the other electrically operating appliances and auxiliary equipment, and the external ambient temperature sensor 60.

Each battery monitoring module 18 is provided with at least one or more other auxiliary inputs and outputs 62, which are required to monitor and control any electrically operating appliances or auxiliary circuits or equipment that may be associated with the respective cells or battery modules 14. The battery monitoring modules 18 further include one or more additional inputs and outputs, also shown at 62, as may be required to connect and control any sensors which are provided to sense cell or battery temperature, or internal cell or battery pressure or electrolyte level, within the modules 14.

Provision of circuits in keeping with FIG. 1 allows for a wide range of DC input voltages which may be brought to the input multiplexer of the electric monitoring system, particulary when the input multiplexer may be such as is taught in U.S. Pat. No. 5,206,578, referenced above. As will be readily noted from FIG. 1, cumbersome wiring of all of those DC input voltages to a central point is essentially eliminated. Still further, there may be a broad spectrum of severe voltage transients and electrical noise that may be induced by fast switching of heavy current in wiring 38, due to the action of the charger to which the battery 12 might be connected, or the traction controller 34, or other loads such as air conditioners. Clearly, the problems of a wide range of DC input voltages and of cumbersome wiring, and of pick up of noise and interference in such wiring, are overcome by the present invention as a consequence of its modularization.

It thus becomes clear that data from a number of battery monitoring modules 18 may be communicated to the main control module 16 over the serial communications bus 24. Thus, only a few wires are needed to communicate to the main control module, since the communications bus 24 is daisy-chained to all of the battery monitoring modules 18.

In practice, a typical battery monitoring module 18 may have 8 to 16 inputs. Thus, if they are monitoring 8 12-volt modules, or 16 6-volt modules, each battery monitoring module is only monitoring 96 volts of modules 14 within the long chain battery 12. Therefore, the common mode voltage range of an input multiplexer, as noted above, may be kept below 100 to 150 volts.

The battery monitoring modules 18 are advantageously located in proximity to the cells or battery modules 14 with which they are associated. This keeps the lengths of all analog wiring 28 to a minimum.

By providing galvanic isolation of the data acquisition circuitry inside each battery monitoring module from its respective communications bus 24, and by digitally encoding data and other transmissions over the serial communications bus 24, analog signals within the circuits of the present invention will be limited in distance and common mode range because of the modularization employed. Moreover, the magnitude of pickup of transients and noise delivered to the analog inputs is considerably reduced. This approach will then eliminate external analog wiring beyond the battery monitoring modules 18.

Each respective battery monitoring module 38 input is also capable of monitoring the resistance of the power wiring 38 between the connecting points of two adjacent sensing wires 28. In keeping with a provision of the present invention, if all battery current carrying wiring which is external to each module 14 is, itself, monitored for changes in resistance or voltage that may occur therein by one or more of the battery monitoring modules 18, through a respective input to such module or modules, then the problems arising in such wiring may be diagnosed and overcome. Obviously, loose, corroded, or otherwise faulty, contacts, particularly in the current carrying wiring 38, can be a safety hazard since they may lead to melt-down, electrical are, and ultimately to fire. If, however, the nodal sensing wires 28 are connected to the power cable clamps 66, as shown, then high or increasing contact resistance can be easily detected. This is because the resistance of the interconnecting wires and of the contacts on both the battery posts in any module 14 are essentially added to the internal resistance of that module 14.

Still further, additional points in the power cabling may be monitored, beginning at the power delivery connector 42b, 42a, as well as the traction system comprising the electric motor 32 and the traction controller 34, and this may be accomplished by dividing the current carrying wiring 38 into convenient sections for the purposes of monitoring. Thus, some of the inputs to the individual battery monitoring modules may be assigned for those purposes; and thus, resistive drop along those sections of wiring and high or increasing values of resistance therein, will be detected. This will provide early warning of dangerous circumstances developing, and because of the modularization employing a plurality of battery monitoring modules, the location of the incipient danger may be pin-pointed.

Turning now to FIG. 2, the question of adaptive current routing is now discussed.

It has been established above that the battery 12 is comprised of a long chain of series connected modules 14. As it happens, the capacities of each of the individual modules or cells 14 may vary by as much as 5% to 10%. Also, the capacity of the weakest module—that is, its capability of accepting charge or delivering discharge current—will determine the useful capacity of the entire battery. However, the present invention will preclude the possibilities of overcharge or overdischarge of any of the individual modules 14. This may be brought about during an equalization charge, which may be performed every 10th to 20th time that the battery 12 is recharged. The weaker cells or modules in the battery will be able to tolerate an extra 5% to 10% of overcharge that they may receive, since this overcharge—which is necessary to bring the highest capacity modules up to full charge condition—is delivered at a relatively low and carefully controlled rate in keeping with the teachings of the NOR or NOR et al battery charging patents referenced above.

However, if the spread of capacities is in the range of 10% to 30%, this is much less favourable to precluding overcharge or overdischarge simply by providing equalization charges every 10th to 20th cycle. The present state of manufacturing of batteries is such that differences of capacities in the range of 10% to 30% may occur during the battery life, and may not be possible to overcome. If so, then the better quality modules in the battery may be underutilized in operating, to the same extent by weaker modules. The present invention proweaker modules. The present invention provides a switching scheme by which any fully charged or fully discharged module 14 may be bypassed, without comprising the overall ability of the battery 12 to accept charge or to deliver full current. Of course, if individual modules are bypassed, then the battery system voltage will be reduced. If the range of the capacity differences is in the order of from 20% to 30%, then it may be necessary to expect that 20% to 30% of the long chain battery might ultimately be bypassed. While this is generally not acceptable in the long term, it may be acceptable at least in the short term while arrangements are being made to service and replace individual modules in the battery 12. In any event, the present invention provides a solution whereby incalculable, or in some cases irreversible, damage to the battery 12 might be prevented.

Figure 2A:
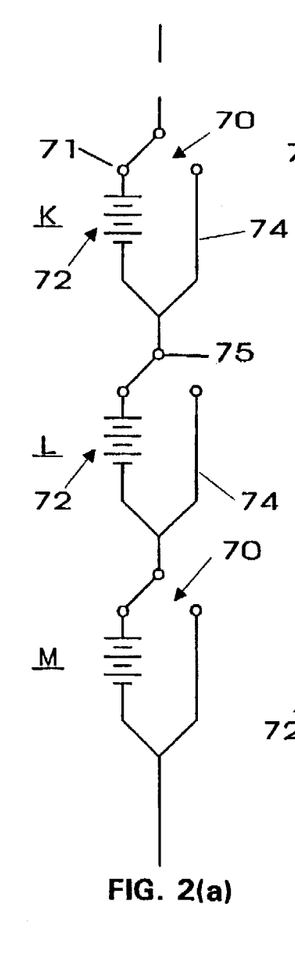
FIG. 2 shows a battery chain of several modules in various bypass configurations in keeping with another feature of the present invention.
Figures 2B, 2C:
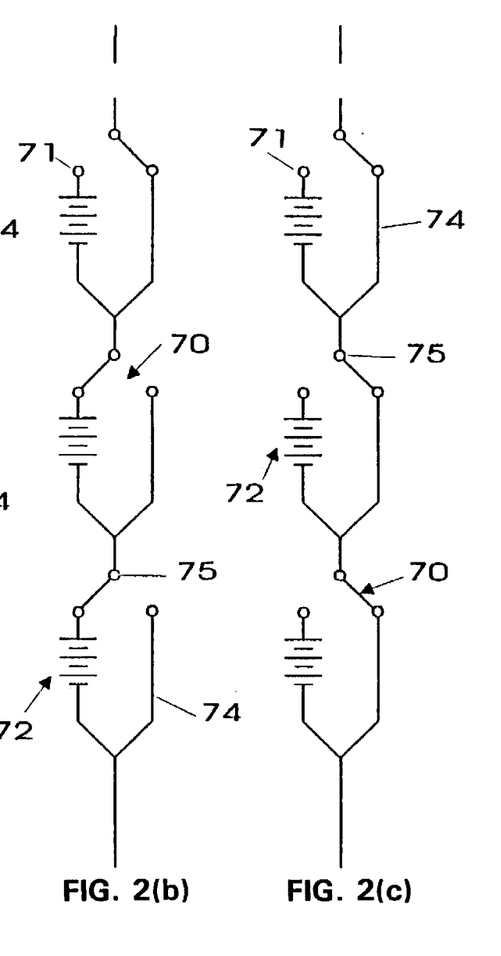

Three modules K, L, M, are shown in FIGS. 2(a), 2(b), and 2(c). Each module K, L, and M has a high capacity single pole, double throw switch 70. A cell or battery 72 is provided for each module, and a bypass current conductor 74 is also provided for each module. One throw 71 of each single pole, double throw switch 70 is connected to a first end of each cell or battery 72—in this case, shown at the positive end of each cell or battery 72. The other or negative side of each cell or battery 72 is connected to the common point 75 of the next single pole, double throw switch in the series connection of the long chain battery. Each bypass current conductor 74 is also connected to the common point 75 of the next series connected single pole, double throw switch 70.

In FIG. 2(a), no battery in any module K, L, or M, is bypassed; in FIG. 2(b), the battery 72 in module K is bypassed; and in FIG. 2(c), all of the batteries are bypassed.

It can be assumed that, where all of the switches 70 are in the bypass position as shown in FIG. 2(c), this can be designated as the SERVICE position, or it can be controlled to be an automatic default position in the event that the electric vehicle is involved in an accident or crash. In this manner, battery safety is greatly enhanced.

As will be noted from FIG. 2(c), each of the positive ends of the battery 72 are isolated, and the overall battery voltage in the string of modules K, L, and M, is zero volts. Thus, the highest voltage occurring anywhere in the battery compartment, or should any of the battery modules be dislodged, is the voltage of the single module. This substantially precludes any danger of electrical arc or battery fire occurring.

Each of the single pole, double throw switches 70 may be a mechanical switch or a solid state, semiconductor switch. In any event, as discussed above, each of the switches 70 is galvanically isolated from the respective battery monitoring module 18.

If mechanical switches are used, there may be losses of, say, 1% to 3% of the battery energy, depending on the design and particular type of mechanical switch that is being utilized. However, there may be the problem of contact reliability and wear. In order to minimize substantive damage to the contacts in the mechanical switches, it may be arranged that they are operated and switched from one pole to the other, or they may be timed to operate, only when the battery current is interrupted or when it is at or near zero.

If semiconductor switches are employed, then there may occur a conductive loss of, say, 0.5 volts to 1 volt per module, whereby 4% to 8% of the battery voltage might be lost. Thus, 4% to 8% of the battery energy capable of being delivered from the battery 12 might be lost per discharge, and twice as much as that—thus, 8% to 16% of the stored energy in the battery 12—might be lost during each charge/discharge cycle of the battery 12. This may be considered, however, to be an acceptable loss given the increased safety considerations that are provided, and it may become less of a concern as better switches with lower losses are developed and become available.

Figure 3:
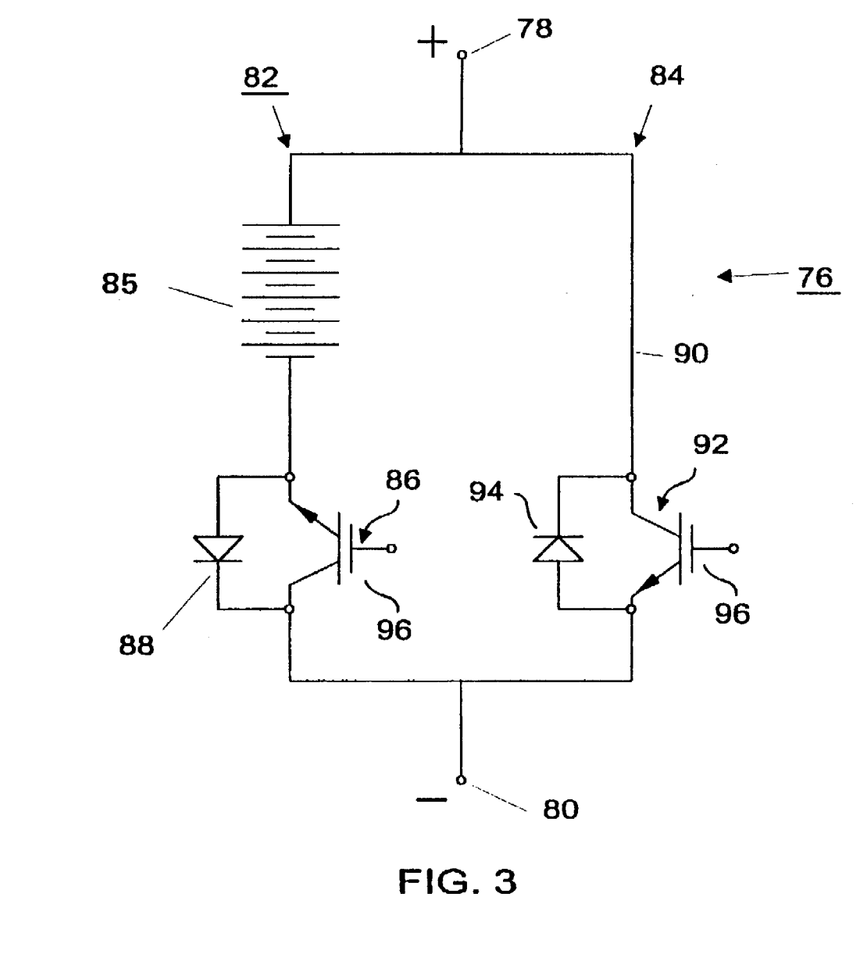
FIG. 3 is a schematic of a battery module in keeping with a further provision of the present invention.

Referring now to FIG. 3, a typical module 76 is shown. That module is configured as a two-terminal module having terminals 78 and 80, and sides 82 and 84. On side 82, a cell or battery 85 is provided which is in series with a parallel connection of a first semiconductor switch 86 and a free wheeling diode 88. In this case, the free wheeling diode is forward facing, with respect to the polarity of the cell or battery 84. Side 84 comprises a bypass conductor 90 in series with a further semiconductor switch 92 in parallel with a further free wheeling diode 94. In this case, free wheeling diode 94 is rearward facing, having regard to the polarity of battery or cell 85. Each of switches 86 and 92 may be galvanically isolated such as by optocoupler (not shown), or otherwise, from the respective battery monitoring module 18 to which the module 76 is connected. Conveniently, the switches 86 and 92 may be MOSFETs, or more particularly they may be IGBTs (Isolated Gate Bipolar Transistor) as shown at 96. IGBTs provide low voltage isolation, and are capacitively coupled.

It will be seen that when both switches 86 and 92 are OFF—that is, non-conductive—the module 76 is deactivated. Any small load imposed on the module 76 will bring its voltage to zero, since only leakage current will flow through diode 88. However, charging is possible due to the polarity of diode 88. Any discharge current to which the module 76 is subject to will bypass the module via diode 94.

If switch 86 is ON—that is, conductive—and switch 92 is OFF—that is, non-conductive —then the module 76 is activated and discharge current will flow through switch 86 while charge current will flow through diode D1. If the reverse situation is true, with switch 86 being OFF and switch 92 being ON, then the module 76 is bypassed and battery charge current will flow via switch 92 while discharge current will flow via diode 94.

It is obvious that the condition where both switches 86 and 92 are ON at the same time must not happen. This circumstance will be prevented or precluded by providing an interlock control means in the respective battery monitoring module 18.

Turning now to FIGS. 4 through 8, various methods for determining the internal electrochemical potential of battery 12 or any battery module 14, in keeping with the present invention, are now discussed.

As discussed in the NOR and NOR et al battery charger patents referenced above, as a battery is being charged, the charge current is periodically interrupted, such as under the control of the charging station interface or on-board charger interface 48 or 50. The electric vehicle may be configured that no necessary loads are connected to the battery 12; it being possible that clocks, on-board computers, cellular phones, system monitoring devices, and the like, may be separately powered from an auxiliary SLI battery installed in the electric vehicle. Such SLI battery may be, for example, a standard automobile battery.

Figure 5:
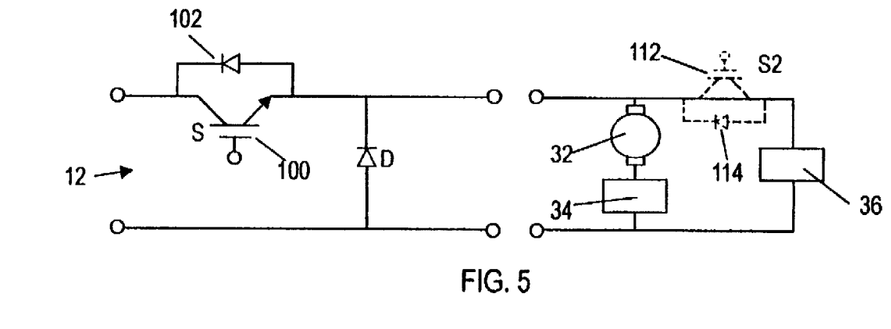
FIG. 5 shows an alternative circuit whereby one or other current interruption switches are provided in the traction circuit of an electric vehicle embodying the present invention.

To maintain control of the battery 12, it is always desirable to take resistance free voltage readings during discharge, as well—that is, while the vehicle is being operated. This may comprise interrupting the entire battery current, interrupting or reversing the electrical motor current, interrupting the current being delivered to the other electrical loads in the vehicle; or in keeping with a particular provision of the present invention, superimposing an extra load pulse on the battery 12. Those steps may be carried out in a variety of manners, as follows:

In the first instance, having reference to FIG. 5, it may be possible to open switch 100; but in that case, the entire current flowing to the motor 32 and other loads 36 is interrupted. This may be unacceptable. Thus, the other methods described below are postulated by the present invention.

Figure 4:
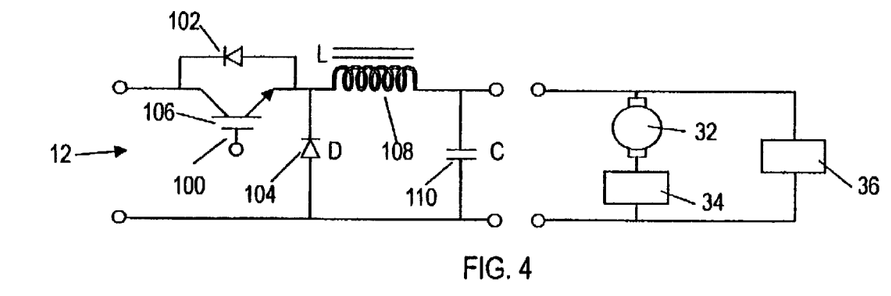
FIG. 4 is a circuit showing the arrangement in an electric vehicle whereby an additional storage filter is provided.

Now, having regard to FIG. 4, a parallel connection of a high current capacity switch 100 and a rearward facing diode 102 is provided in series with the electric motor 32 and traction controller 34. A free wheeling diode 104 is provided in parallel with the motor 32 and traction controller 34. The switch 100 is galvanically isolated, as at 106, from the main control module 16.

An energy storage filter comprising an inductor 108 in series with switch 100, or a capacitor 110 in parallel with the free wheeling diode 104, or both, is provided. The current capacity of switch 100 must be such as to be able to carry the maximum battery current rated for the battery 12 and electric vehicle—for example, 500 amperes. Likewise, the free wheeling diode 104 must have the same rating so as to smooth the switching transient.

In the embodiment of FIG. 5, the switch 100 is opened periodically. Because the motor 32 is under load, it will present only a small inductive load component, and the motor current through it will cease for a few milliseconds. Since repeated diagnostic interruptions, even if they are only in the order of from 5 to 10 milliseconds, might be heard and/or felt by the occupants of the electric vehicle, the energy storage filter is provided, as shown in the embodiment of FIG. 4. Thus, when the switch 100 is opened, and if it is opened for a diagnostic period of time which is less than the time constant of the energy storage filter 110, 108, energy will continue to be fed to the electric motor 32. At that time, however, a resistance free voltage reading of the battery, or each cell or battery module therein, can be taken.

However, such an arrangement requires additional cost, it adds additional weight to the electric vehicle, and the circuit components take additional volume within the vehicle.

Figure 6:
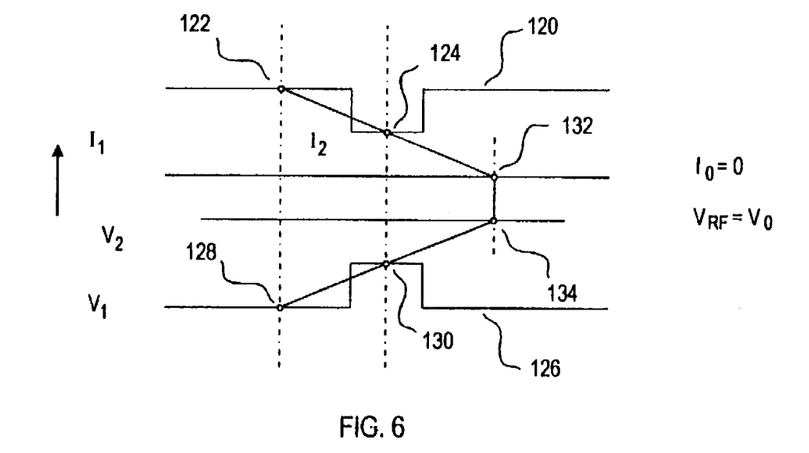
FIG. 6 shows representative current and voltage curves when current flowing through the battery is reduced, and from which resistance free voltage in the battery may be extrapolated.

A further method for taking resistance free voltage readings is contemplated in the traction circuit of the electric vehicle essentially as illustrated in FIG. 1. Here, the traction controller 34 may be controlled in such a manner that the instantaneous current flowing through the battery 12 can be reduced by controlling the traction controller 34 whereby the electric motor 32 will draw from zero to about 50% of the current flowing through the electric motor just prior to a diagnostic period. That diagnostic period may be from about 3 to about 10 milliseconds. However, as the motor current is reduced even to zero, additional current is still being drawn by other loads such as lights, heating, or air conditioning. In any event, a current reading of current through the long chain battery 12 is made during the diagnostic period. Then, the current reading taken just prior to the diagnostic period is compared with the current reading taken during the diagnostic period; and mathematical extrapolation by which the resistance free voltage of the battery 12 may then be determined due to the linear relationship of the direct current voltage, the current, and the resistive load in the circuit, according to Ohm's law, is made in the following manner:

The manner of mathematic extrapolation to derive the resistance free voltage is discussed with reference to FIG. 6. Here, a current curve 120 is shown, and when the current is reduced it is reduced from current level $I_1$, shown at 122, to current level $I_2$, shown at 124. At the same time, the voltage curve 126 shows the voltage level increasing from a first level $V_1$ at 128 to a second voltage level $V_2$ shown at 130. Reasonably good accuracy can be assumed, since the motor current represents a major portion of the load imposed on the battery 12.

If points 122 and 124 are accurately determined, and points 128 and 130 are also accurately determined, then it is possible to extrapolate the current to zero current—knowing the values of the current at points 122 and 124—as shown at 132. It follows, therefore, that the voltage can be extrapolated to point 134, which is equivalent to the resistance free voltage or $V_0$, in keeping with the following equations and their properties, assuming, as noted above, that current $I_0$ is zero and that voltage $V_0$ is the resistance free voltage $V_{RF}$:

$$\frac{I_1 - I_2}{I_1 - I_0} = \frac{V_1 - V_2}{V_1 - V_0}$$

$$\frac{I_1 - I_2}{I_1} = \frac{V_2 - V_1}{V_{RF} - V_1}$$

$$V_{RF} = V_1 + \frac{I_1(V_2 - V_1)}{I_1 - I_2}$$

It should be noted that, because the electric motor 32 remains under control of controller 34 at all times, the method described above offers certain distinctive variations. For example, the torque delivered by the motor may be specifically altered or notched, in pulses, such as by bringing the battery current to half the full load current; or the battery current may be reduced to zero such as by generating a negative motor current, which is equal in magnitude to the current drawn by the other electrical loads 36.

A further method of determining resistance free voltage $V_{RF}$ is also to be determined with reference to FIG. 5. Here, a further parallel connection of switch 112 and rearward facing diode 114 is provided in series with the other vehicle electrical loads 36, beyond the series connected electric motor 32 and traction controller 34. Once again, the switch 112 is galvanically isolated from the main control module 16. In this case, only switch 112 is operated; and the method calls for reading the instantaneous current flowing through the battery 12, periodically interrupting the control of current to the other loads 36 by opening switch 112 for a diagnostic period of time, and taking a current reading of current through the battery 112, while switch 112 is open. In this case, switch 100 is not controlled, and remains closed at all times. The current readings just prior to the diagnostic period of time, and during the diagnostic period of time, are again compared, and the resistance free voltage $V_{RF}$ is mathematically extrapolated in the manner described above.

In this case, the current through switch 112 may be considerably lighter than the current through motor 32; and accordingly, the accuracy of the measurements taken because the interrupted current may be small in relation to the total current, is compromised.

Figure 7:
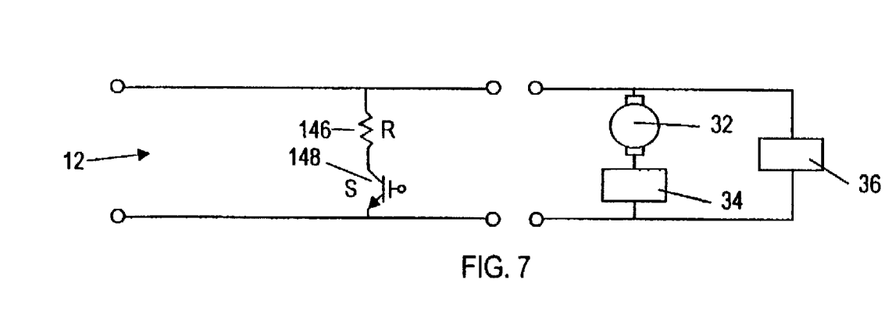
FIG. 7 shows yet another embodiment of the traction circuit of an electric vehicle embodying the present invention, wherein an additional load resistor and switch are provided.

Finally, a more accurate method for determining resistance free voltage of battery 12 or any battery module 14 is provided in keeping with the following discussion:

First, reference is made to FIG. 7, where a further load resistor 146 and a relatively high current capacity switch 148 are provided in series, and they are then provided in parallel with the series connected electric motor 32 and traction controller 34. Once again, the switch 118 is galvanically isolated from the main control module 16.

Here, the instantaneous current flowing through the battery 12 is read, and periodically the switch 148 is closed for a diagnostic period of time. While switch 148 is closed, a current reading of current through the long chain battery 12 is again taken. Once again, the current reading taken just prior to closing the switch 148 and the current reading taken during the diagnostic period while switch 148 is closed are compared; and by mathematic extrapolation, the resistance free voltage $V_{RF}$ may be determined with greater accuracy.

Figure 8:
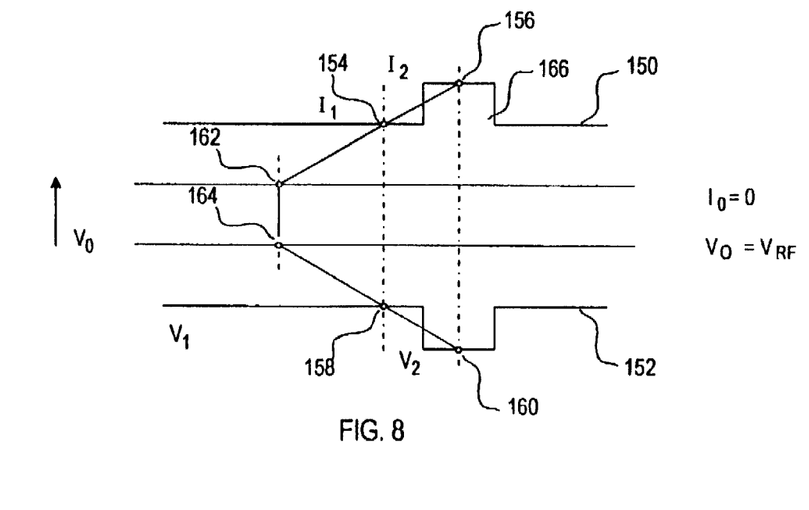
FIG. 8 shows current and voltage curves for extrapolating the resistance free voltage of the battery when the circuit of FIG. 5 is operated.

This greater accuracy is shown with reference to FIG. 8. Here, a current trace 150 and a voltage trace 152 are shown. The steady state current $I_1$ is shown at 154, and the instantaneous current $I_2$, which flows when switch 148 is closed, is shown at 156. Likewise, voltage $V_1$, shown at 158, depresses to voltage $V_2$, shown at 160, during the diagnostic pulse. Again, the zero current position 162, for $I_0$, can be extrapolated, as can the voltage $V_0$ at 164, using the following expressions, where $I_0$ equals zero, $V_0$ equals $V_{RF}$, and where $(I_2-I_1)$ equals $\Delta I$:

$$\frac{I_1 - I_2}{I_1 - I_0} = \frac{V_1 - V_2}{V_1 - V_0}$$

$$\frac{\Delta I}{I_1} = \frac{V_1 - V_2}{V_{RF} - V_1}$$

$$V_{RF} = V_1 + \frac{I_1(V_1 - V_2)}{\Delta I}$$

In the method described above, with respect to FIGS. 7 and 8, it may be assumed that the switch 148 is turned on for a diagnostic period of, say, 10 milliseconds, whereby the total battery current is raised from $I_2$ to $I_2$. Thus, as explained above, the resistance free voltage $V_{RF}$ may be obtained by extrapolation from values $V_1$ and $V_2$, using linear extrapolation due, once again, to Ohm's law.

The pulse magnitude of current pulse 166 might be comparable to the traction current—in other words, the value of $I_2$ may be approximately twice the value of $I_1$—and thus reliable and accurate determinations may be made since the magnitudes of current are appreciable. However, by increasing the current from $I_1$ to $I_2$, there is no interference with the operation of the electric vehicle, the electric motor 32, or any of the other electrical loads 36. Thus, imposition of the diagnostic pulse 166 should be rendered undetectable by the driver of the vehicle, and the occupants of the vehicle.

As to the energy being consumed, if it is assumed that the vehicle has a 30 kWh battery which operates with an average power draw of 15 kW, and then a diagnostic pulse of a further 15 kW is imposed, that pulse might be 75 amperes at 200 volts. If the width of pulse 166 is 10 milliseconds, and it is repeated every 10 to 30 seconds, or even every 5 to 30 seconds, then the average power draw will generally be no more than about 15 watts. Of course, while the resistor 146 and the switch 148 must be dimensioned for the maximum current of, say, 75 amperes, the power dissipation will only be 15 watts. Thus, both the resistor 146 and the switch 148 may be quite small and inexpensive. Moreover, the resistor 146 may be added to the vehicle heater, so that any heat generated thereby is projected into the cab of the electric vehicle when heating is used.

Figure 9:
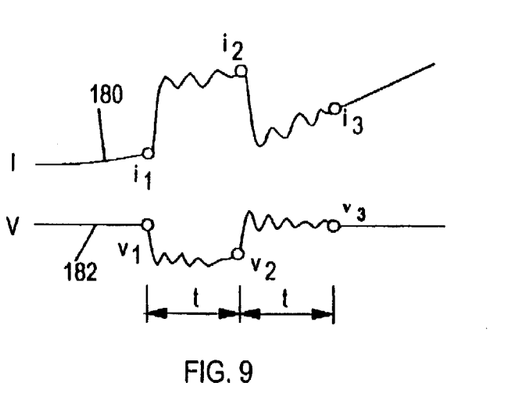
FIG. 9 shows typical current and voltage traces as several readings are taken before, during, and after, a diagnostic pulse.
Figure 10:
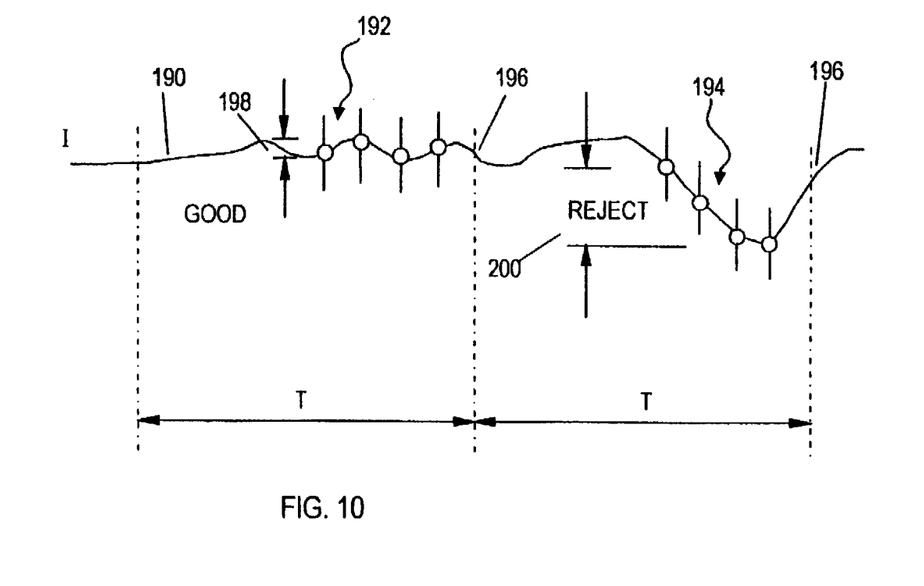
FIG. 10 shows a current pulse where a plurality of readings are taken just prior to, at the initiation of, and following, a diagnostic pulse.

Turning now to FIGS. 9 and 10, the following discussion is directed to improvements whereby more accurate voltage or current readings may be taken.

It must be recognized that, in order to obtain correct readings of the electrochemical potential, the electrochemical charge or discharge reaction that is ongoing in the battery 12 must be in equilibrium. Moreover, the diagnostic reading occurring during the diagnostic period of time must be taken shortly after a step change in current, having reference to FIGS. 6 and 8, and thus soon after the electrical transient occurring in the battery due to the step change of current has died out. As described in the NOR or NOR et al patents referenced above, this condition of equilibrium is inherently met in battery chargers that are in keeping with the NOR or NOR et al patents referenced above. Typically, in a long chain battery employed in an electric vehicle, and particularly when it is cruising or in steady acceleration, or in any event is in equilibrium, the electrochemical processes have time constants in the order of about 0.5 seconds. Thus, several seconds may be needed to reach an equilibrium or steady state in the event that a change occurs. Readings taken during, or soon after, disturbances of this steady state equilibrium of the battery, such as those taken when there are sudden changes of the accelerator or brake pedal positions, or other loads changes, must be discarded.

FIG. 9 shows typical current and voltage curves 180 and 182. In keeping with this Figure, three readings are taken at identical time intervals "t". Readings $i_1$ and $v_1$ are taken just before the diagnostic pulse shown in either FIG. 6 or 8; readings $i_2$ and $v_2$ are taken just before the end of the diagnostic pulse; and readings $i_3$ and $v_3$ are taken after a further time interval "t" which occurs after the diagnostic pulse. From these values, particularly with respect to the methods employed in keeping with FIGS. 7 and 8 above, the values of $I_1$, $I_2$, $V_1$, and $V_2$ may be determined in keeping with the following relationships:

$$\frac{i_1 + i_3}{2} = I_1$$

$$i_2 = I_2$$

$$\frac{v_1 + v_3}{2} = V_1$$

$$v_2 = V_2$$

From that, the slope which characterizes those three readings may be calculated using the following determination:

$$\frac{\Delta \text{reading}}{\Delta t} = \frac{\text{reading 3} - \text{reading 1}}{2t}$$

Thus, if the calculated slope exceeds a predetermined value, the readings that are taken in those circumstances may be discarded because they are not indicative of true electrochemical potential of the electrical charge or discharge reaction taking place in the battery 12.

In general, each of the three readings shown in curves 180 and 182 may be determined by taking several discrete readings within short time intervals of, say, between 5% to 20% of the interval "t"; for example, 4 to 16 readings over 1 to 2 milliseconds. Those readings may then be digitally filtered and averaged so as to achieve high noise rejection and accuracy. Using this three point method, readings taken during a sudden change in lead current may be precluded or discarded.

Having regard now to FIG. 10, a steady state or trend method for taking readings may be practised. Here, curve 190 shows two series of readings indicated generally at 192 and 194, and taken during two different intervals T. Those intervals may be from 5 to 30 seconds long, typically about 10 seconds, and in each interval T, a series of 2 to 10 readings may be taken in the 2 to 4 seconds that just precede the initiation of each diagnostic pulse as indicated at 196. Each of the readings in the series of readings are compared one to another.

If each of the series of readings fails within a predetermined range, such as 198, or if it is assumed that the slope of range 198 may gently rise or fall so that each succeeding reading may be either higher or lower than the preceding reading within a predetermined range, then in any event the readings are accepted because they are indicative of equilibrium of the electrical charge or discharge reaction that is ongoing in the long chain battery 12 during that interval T.

If, on the other hand, the readings are within a range 200, then the readings are rejected.

Figure 11:
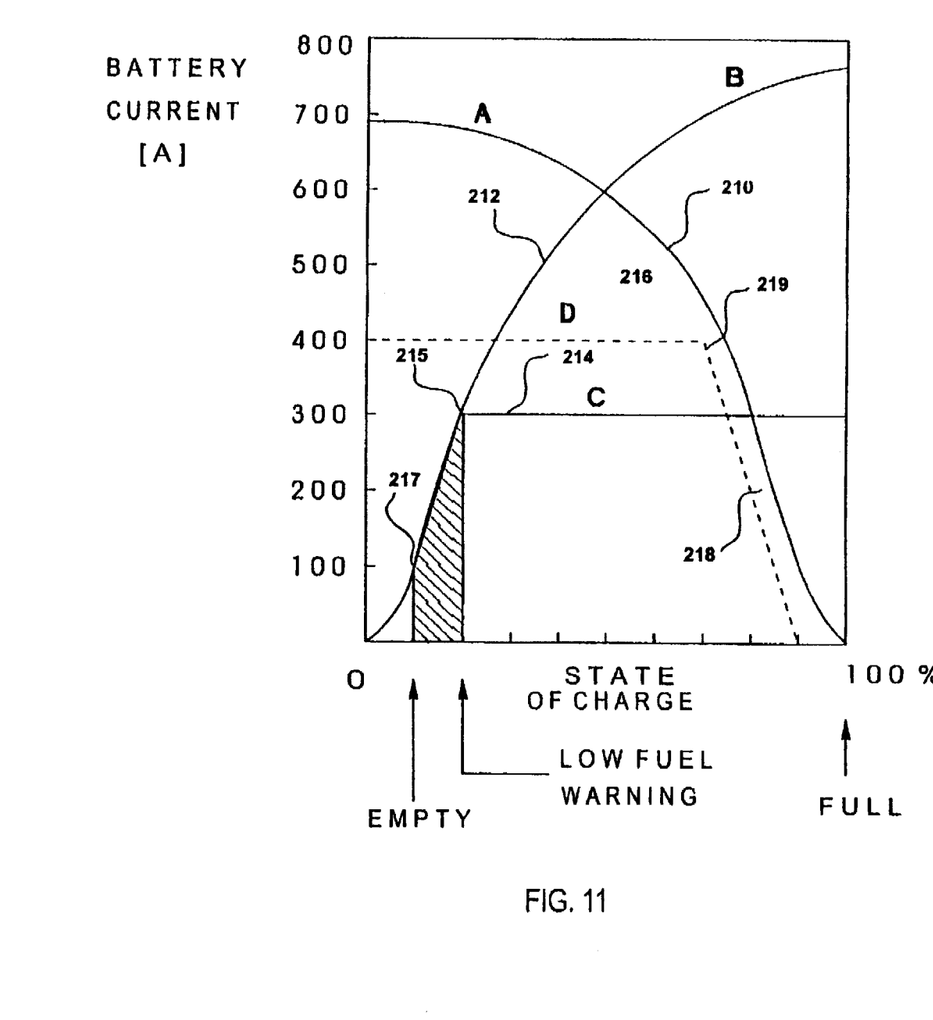
FIG. 11 shows typical charge acceptance and discharge ability curves, and typical controlled discharge and regenerative braking charge curves, for a long chain battery in an electric vehicle.

Finally, turning to FIG. 11, the present invention provides means for preventing overcharge or overdischarge, as well as providing a better "fuel gauge" for the electric vehicle.

Here, it is recognized that wasteful and damaging overcharge must be precluded, and on discharge the current draw must be maintained so that the electrochemical cell potential is kept above a predetermined minimum safe value. A characteristic charge acceptance curve 210, and a characteristic discharge ability curve 212, can be determined for the long chain battery 12. Each of curves 210 and 212 is a plot of battery current related to the state of charge of the battery. If the battery is operated above curve 210, it is in overcharge conditions; and if the battery is operated above curve 212, it is in overdischarge conditions.

As the vehicle is being driven, the operating point of battery current versus state of charge must remain below curve 214. The flat portion of curve 214 is arbitrarily determined, but is established so as to permit acceptable operation of the vehicle without causing damage to the battery.

In the range of the state of charge of the battery from 20% up to 100%, the current drawn from the battery is primarily controller limited, for example, to no greater than 300 amperes. However, at about 20% state of charge, curve 212 will be intersected at point 215, and the monitoring and control functions and circuits within the main control module 16 will cause the current to be limited progressively downwardly. At the same time, a "low fuel" warning may be annunciated on the dashboard of the vehicle. When the discharge ability of the battery drops to a predetermined limit, such as at point 217 on curve 212—at 100 amperes, for example—a further annunciation will flash on "fuel gauge" that the battery 12 is effectively empty. Then, the driving time may be limited to a short period of time—say, 60 seconds to several minutes—and finally, the traction system and other major loads on the battery may be disabled.

During regenerative braking of the vehicle, the electric motor 32 becomes a generator, and heavy currents may flow from it back into the battery 12. If the battery is fully or nearly fully charged, this could cause damage to the battery. Thus, a limit for regenerative bring current acceptance is determined by curve 216.

Here, for example, regenerative current may be limited by the traction controller to 400 amperes up to about 70% the state of charge, and then progressively limited down to zero amperes at about 90% state of charge of the battery. Thus, regenerative charging current is limited to no greater than the maximum allowable; and it is continuously monitored so that when the state of charge approaches the predetermined level at point 219 (70% state of charge), which is just less than the point at which the charge acceptance curve 210 would be intercepted by the maximum allowed regenerative charging current, the regenerative charging current is controlled as at 218 to always stay below the charge acceptance curve 210 as the state of charge of the battery increases.

Accordingly, the charge and discharge ampere-hours accepted by the battery and delivered by it are integrated, in keeping with the present invention, between the end points which are representative of "EMPTY"—at, for example, 10% state of charge—and "FULL"—at 100% state of charge. Instantaneously, a determination of the state of charge from cell voltages or electrochemical potentials may be unreliable, but the integrating method in keeping with the present invention, and the application of a mathematical model, which applies corrections for the battery temperature and current, and assumes predetermined values of charge efficiency, so that controlled charge and discharge are not damaging to the battery. As long as charge and discharge of the battery 12 are operated consistently below the charge acceptance curve 210 and the discharge ability curve 212, then the efficiency of operation remains high and consistent. Cumulative errors may be eliminated at the FULL point, when it is reached on equalization charge every 10 or 20 charge/discharge cycles, and then scale correction may be applied when the LOW FUEL or EMPTY points are reached.

Accuracy of the integrity method can be further enhanced by calculating the amount of self-discharge of the battery in the standby mode (when the vehicle is not in use), from the self-discharge rate of the given battery, with or without temperature correction, and length of time. This implies that the battery energy monitoring circuitry must operate—with very low power demand—even when the vehicle is not used.

There has been described battery energy monitoring circuits and methods for a long chain battery. The discussion is applicable particularly, but not necessarily, to when the battery is installed in an electric vehicle. The battery operation may be controlled at all times during its operation, during charge, discharge, or regenerative charge during braking of the vehicle, and in standby, without damage to the battery. By galvanic isolation of all operating switches and the like associated directly with battery modules, safety is assured; errors are dramatically reduced by digital encoding of data on communications buses, and by following appropriate methods of determining readings of current and voltage and resistance free voltage, all as described above. As noted, safety of the vehicle or installation may be assured by monitoring the high current wiring, as well as by assuring that nodal wiring is connected at power connectors for each battery module. Meaningful annunciation as to the state of charge of the battery—the fuel gauge—is assured.

The invention has been described by way of exemplification only. Other modifications and specific circuit arrangements may be provided without departing from the spirit and scope of the accompanying claims.

What is claimed is:

1. A method of taking the resistance free voltage reading of a long chain battery during charging from a battery charger or discharge thereof, wherein said long chain battery is installed in an electric vehicle together with a monitoring and control apparatus therefor;

wherein said long chain battery comprises a plurality of series connected cells or battery modules;

wherein said electric vehicle has installed therein a main control module, at least one battery monitoring module which is associated with a respective plurality of cells or battery modules, a current sensor means in series with said long chain battery, a vehicle communication bus, a drive controller, an electric motor and a traction controller therefor in series across said battery, other vehicle electrical loads in parallel with said series connected electric motor and traction controller, current control means and current flow interruption means within said main control module, a serial communications bus, and voltage reading means for receiving and storing voltage information for each cell or battery module from each of said battery monitoring modules;

wherein said method comprises following any one of the following steps:

I: providing a parallel connection of a high current capacity switch and a rearward facing diode in series with said electric motor and traction controllers; a free wheeling diode in parallel with said series connected electric motor and traction controller, and an energy storage filter comprising an inductor in series with said switch or a capacitor in parallel with said switch, or both; periodically interrupting the control of current through said switch by opening said switch for a diagnostic period of time less than the time constant of said energy storage filter so as to continue to feed electrical energy to said electric motor; and taking a voltage reading for each cell or battery module while said switch is open;

II: providing means for controlling said traction controller; reading the instantaneous current flowing through said long chain battery; controlling said traction controller whereby said electric motor may be controlled to draw a current which is significantly different from the current just previously flowing to said electric motor for a diagnostic period for from about 3 to about 10 ms, taking a current reading of current through said long chain battery during said diagnostic period; comparing the current reading taken just prior to said diagnostic period with the current reading taken during said diagnostic period, and mathematically extrapolating the resistance free voltage from said current readings, due to the linear relationship of direct current voltage, current, and resistance under Ohm's law;

III: providing means for controlling said traction controller; reading the instantaneous current flowing through said long chain battery; controlling said traction controller whereby said electric motor may be reversed for a brief diagnostic period to a level which is equal to the current being drawn by said other electrical loads, whereby the current flowing through said battery is reduced to zero; and determining the resistance free voltage of said long chain battery while the current flow therethrough is zero;

IV: providing a parallel connection of a high current capacity switch and a rearward facing diode in series with said other vehicle electrical loads but beyond said series connected electric motor and traction controller; reading the instantaneous current flowing through said long chain battery; periodically interrupting the control of current through said switch by opening said switch for a diagnostic period of time; taking a current reading of current through said long chain battery while said switch is open; and comparing the current reading taken just prior to opening said switch with the current reading taken during said diagnostic period, and mathematically extrapolating the resistance free voltage from said current readings, due to the linear relationship of direct current voltage, current, and resistance under Ohm's law; or V: providing a series connection of a further load resistor and a high current capacity switch, in parallel with said series connected electric motor and traction controller, wherein said switch is galvanically isolated from said main control module; reading the instantaneous current flowing through said long chain battery, periodically closing said switch for a diagnostic period of time; taking a current reading of current through said long chain battery while said switch is closed; and comparing the current reading taken just prior to closing said switch with the current reading taken during said diagnostic period, and mathematically extrapolating the resistance free voltage from said current readings, due to the linear relationship of direct current voltage, current, and resistance under Ohm's law.

2. The method of claim 1, wherein for any voltage or current readings taken, three readings are taken at identical time intervals, where the first reading is taken just prior to the initiation of the diagnostic period, the second reading is taken after time interval "t" during said diagnostic period and just before the end thereof, and the third reading is taken after a further time interval "t" which occurs after said diagnostic period; calculating the slope characterizing the three readings by the following determination:

$$\frac{\Delta \text{reading}}{\Delta t} = \frac{\text{reading 3} - \text{reading 1}}{2t}$$

and if the calculated slope exceeds a predetermined value, discarding the readings as being not indicative of equilibrium of the electrical charge or discharge reaction of said long chain bakery.

3. The method of claim 2, wherein each of said three readings is determined by taking several discrete readings taken within short time intervals of between 5% to 20% of interval "t", and then digitally filtering and averaging said discrete readings.

4. The method of claim 1, wherein for any voltage or current readings taken, said diagnostic pulses occur from 5 to 30 seconds apart, a series of 2 to 10 readings are taken in the 2 to 4 seconds just preceding the initiation of each diagnostic pulse, and then said series of readings are compared one to another; and if each of said series of readings falls within a predetermined range, or if each succeeding reading is either higher or lower than the preceding reading within a predetermined range, then said readings are accepted as being indicative of equilibrium of the electrical charge or discharge reaction of said long chain battery.

* * * * *